United States Patent
Han et al.

(10) Patent No.: US 11,937,513 B2
(45) Date of Patent: Mar. 19, 2024

(54) MAGNON SPIN VALVE, MAGNON SENSOR, MAGNON FIELD EFFECT TRANSISTOR, MAGNON TUNNEL JUNCTION AND MAGNON MEMORY

(71) Applicant: Institute of Physics, Chinese Academy of Sciences, Beijing (CN)

(72) Inventors: Xiufeng Han, Beijing (CN); Ping Tang, Beijing (CN); Chenyang Guo, Beijing (CN); Caihua Wan, Beijing (CN)

(73) Assignee: Institute of Physics, Chinese Academy of Sciences, Beijing (CN)

( * ) Notice: Subject to any disclaimer, the term of this patent is extended or adjusted under 35 U.S.C. 154(b) by 77 days.

(21) Appl. No.: 17/079,422

(22) Filed: Oct. 24, 2020

(65) Prior Publication Data
US 2021/0043829 A1     Feb. 11, 2021

Related U.S. Application Data

(62) Division of application No. 16/225,820, filed on Dec. 19, 2018, now abandoned.

(30) Foreign Application Priority Data

Dec. 25, 2017   (CN) .......................... 201711415711.5

(51) Int. Cl.
| | |
|---|---|
| *H10N 50/80* | (2023.01) |
| *H01F 10/32* | (2006.01) |
| *H10N 50/10* | (2023.01) |
| *H10N 50/85* | (2023.01) |

(52) U.S. Cl.
CPC ............. *H10N 50/80* (2023.02); *H01F 10/32* (2013.01); *H10N 50/10* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 6,847,547 B2* | 1/2005 | Albert ..................... | G11C 11/16 365/171 |
| 8,766,383 B2* | 7/2014 | Apalkov ............. | G11C 11/1675 365/158 |
| 2002/0084501 A1* | 7/2002 | Hiramoto ............... | H10N 50/01 257/422 |

(Continued)

FOREIGN PATENT DOCUMENTS

| | | | | | |
|---|---|---|---|---|---|
| CN | 104681710 A | * | 6/2015 | ............. | G11C 11/02 |
| EP | 1124272 A1 | * | 8/2001 | ............. | B82Y 25/00 |

(Continued)

OTHER PUBLICATIONS

JP 2012-015212 A machine translation (Year: 2022).*

*Primary Examiner* — Vincent Wall
(74) *Attorney, Agent, or Firm* — RADLO & SU

(57) ABSTRACT

The present disclosure relates to a magnon spin valve device, a magnon sensor, a magnon field effect transistor, a magnon tunnel junction and a magnon memory. A magnon spin valve device may comprise a first ferromagnetic insulation layer, a non-magnetic conductive layer disposed on the first ferromagnetic insulation layer, and a second ferromagnetic insulation layer disposed on the non-magnetic conductive layer.

3 Claims, 6 Drawing Sheets

<u>300'</u>

| | |
|---|---|
| ⟶ | 310 |
| | 320 |
| ⟵ ----- ⟶ | 330 |
| | 340 |
| ⟶ | 350 |

(56) References Cited

U.S. PATENT DOCUMENTS

2003/0128483 A1* 7/2003 Kamijo ................... G11C 11/15
  365/158
2018/0026177 A1* 1/2018 Sun ........................ H10N 35/85
  365/158

FOREIGN PATENT DOCUMENTS

| EP | 3258501 A1 | * | 12/2017 | ............ | G11C 11/02 |
| JP | 2012015212 A | * | 1/2012 | | |
| WO | WO-2016127768 A1 | * | 8/2016 | ............ | G11C 11/02 |

* cited by examiner

100

300

300'

MAGNON SPIN VALVE, MAGNON SENSOR, MAGNON FIELD EFFECT TRANSISTOR, MAGNON TUNNEL JUNCTION AND MAGNON MEMORY

CROSS REFERENCE TO RELATED APPLICATIONS

This application is a divisional application of U.S. patent application Ser. No. 16/225,820 entitled "Magnon Spin Valve, Magnon Sensor, Magnon Field Effect Transistor, Magnon Tunnel Junction and Magnon Memory," filed on 19 Dec. 2018, which claims priority to Chinese Patent Application No. 201711415711.5, filed on 25 Dec. 2017, the disclosures of which are incorporated herein by reference in their entireties.

TECHNICAL FIELD OF THE DISCLOSURE

The present disclosure generally relates to a field of magnetic devices, and more particularly to a magnon spin valve device, a magnon sensor, a magnon field effect transistor, a magnon tunnel junction and a magnon memory which operate utilizing a magnon flow.

BACKGROUND

Since the Tunneling Magneto-Resistance (TMR) effect was discovered in Fe/Ge/Co multilayer film in 1975 and the Giant Magneto-Resistance (GMR) effect was discovered in magnetic spin valves in 1988, great progress has been made in the research and application of physics and material science in spintronics, especially tunneling transport property and tunneling magneto-resistance effect of spin-dependent electron in a magnetic tunnel junction have become one of the important research fields in condensed matter physics. In 1995, Miyazaki et al. and Moderola et al. respectively discovered a high room-temperature tunneling magneto-resistance effect in the "ferromagnetic metal/Al—O insulation barrier/ferromagnetic metal", once again, a wave of research on magneto-resistance effect has been set off. In the aspect of device application, Johnson proposed a "ferromagnetic metal/nonmagnetic metal/ferromagnetic metal" sandwich all-metal spin transistor structure composed of a ferromagnetic metal emitter, a non-magnetic metal base and a ferromagnetic metal collector in 1993 (see M. Johnson's article, Science 260 (1993) 320). The all-metal transistor may have a speed compared with that of semiconductor Si devices, but may have 10-20 times lower power consumption, about 50 times higher density, and may be radiation resistant, and has memory function, further it may be applied to various logic circuits and processors, etc. of future quantum computers; in 1994, IBM developed a read head that utilizes the giant magneto-resistance effect to increase the hard disk storage density by 17 times to 3 Gb/in$^2$.

The traditional GMR spin valve structure uses a sandwich structure of "magnetic layer/spacing layer/magnetic layer", wherein the magnetic layer is formed of a ferromagnetic conductive material and the spacing layer generally uses a non-magnetic conductive metal layer such as Cu, Ru etc. A current can flow through the GMR spin valve structure vertically or along the in-plane to generate magnetoresistance by using parallel and antiparallel configurations of magnetic moments of the two magnetic layers. In the GMR spin valve structure, although the magnetic layer has a function of modulating electron spin property, its conductivity is generally not as good as that of the conductive spacing layer, therefore, in a case where electrons are transmitted in the conductive magnetic layer, magnitude and noise property of the magnetoresistance are affected to a certain extent.

In another aspect, the effect-field transistor is a core element in modern semiconductor electron devices, however, the problem of high power consumption of the traditional effect-field transistor based on charge hinders the further reduction of the size of electronic devices, which limits the future development of the semiconductor industry, and the so-called Moore's Law (i.e. the integration degree of electronic devices will double every 18 months) is increasingly coming to an end. Therefore, no matter from the perspective of practical application or scientific research, it has become more and more attractive to people's attention and research to find an effect-field transistor based on charge that surpasses the tradition. Although the all-metal spin transistor structure proposed by Johnson et al. has some excellent property, it still uses electrons as a signal carrier, and uses magnetic moments to modulate electronic signals, which still has many deficiencies in signal strength and noise property.

It may be seen that the traditional magnetoelectric devices still have many deficiencies, which affect their practical applications. Therefore, it needs to continue to explore new magnetic devices to overcome the above-mentioned or other deficiencies in the prior Art.

SUMMARY

An exemplary embodiment provides a magnon spin valve device comprising: a first ferromagnetic insulation layer; a non-magnetic conductive layer disposed on the first ferromagnetic insulation layer; and a second ferromagnetic insulation layer disposed on the non-magnetic conductive layer.

Each of the first ferromagnetic insulation layer and the second ferromagnetic insulation layer comprises one or more of the following materials: $R_3Fe_5O_{12}$, $MFe_{24}$, $Fe_3O_4$, $BaFe_{12}O_{19}$, $SrFe_{12}O_{19}$, and their doped compounds, where R is Y, Pr, Nd, Sm, Eu, Gd, Tb, Dy, Ho, Er, Tm, Yb or Lu, and M is Mn, Zn, Cu, Ni, Mg or Co. The non-magnetic conductive layer comprises one or more of the following materials: Cu, Ru, Ag, Cr, and Au. The first ferromagnetic insulation layer has a relatively fixed magnetic moment and the second ferromagnetic insulation layer has a free magnetic moment that is free to change with an external magnetic field. The non-magnetic conductive layer has a thickness smaller than three times of its spin diffusion length. The magnon spin valve device is used as a magnon sensor.

Another exemplary embodiment provides a magnon field effect transistor comprising: a first ferromagnetic region, a second ferromagnetic region, and a third ferromagnetic region each formed of a ferromagnetic material, wherein the second ferromagnetic region is formed of a ferromagnetic insulation material; a first antiferromagnetic region located between the first ferromagnetic region and the second ferromagnetic region, and formed of an antiferromagnetic material; a second antiferromagnetic region located between the second ferromagnetic region and the third ferromagnetic region, and formed of an antiferromagnetic material; and a gate covering the second ferromagnetic region.

In some examples, the ferromagnetic material comprises a ferromagnetic insulation material or a ferromagnetic conductive material, and the antiferromagnetic material comprises an antiferromagnetic insulation material or an antiferromagnetic conductive material. The ferromagnetic insulation material comprises one or more of the following materials: $R_3Fe_5O_{12}$, $MFe_2O_4$, $Fe_{34}$, $BaFe_{12}O_{19}$, and $SrFe_{12}O_{19}$, where R is Y, Pr, Nd, Sm, Eu, Gd, Tb, Dy, Ho, Er, Tm, Yb or Lu, and M is Mn, Zn, Cu, Ni, Mg or Co. The antiferromagnetic insulation material comprises one or more of the following materials: NiO and CoO. The antiferromagnetic conductive material comprises one or more of the following materials: IrMn, PtMn, AuMn, FeMn, PdMn, and NiMn. The first ferromagnetic region, the second ferromagnetic region, and the third ferromagnetic region have magnetic moments parallel to each other.

Another exemplary embodiment provides a magnon logic device comprising: a first ferromagnetic region, a second ferromagnetic region, and a third ferromagnetic region each formed of a ferromagnetic material, wherein the second ferromagnetic region is formed of a ferromagnetic insulation material; a first antiferromagnetic region located between the first ferromagnetic region and the second ferromagnetic region, and formed of an antiferromagnetic material; a second antiferromagnetic region located between the second ferromagnetic region and the third ferromagnetic region, and formed of an antiferromagnetic material; and a gate covering the second ferromagnetic region, wherein the gate is configured as a logic input terminal, either the first ferromagnetic region or the third ferromagnetic region is configured as a logic output terminal.

In some examples, the magnon field effect transistor is configured as a logical "NOT" gate. The ferromagnetic material comprises a ferromagnetic insulation material or a ferromagnetic conductive material, and the antiferromagnetic material comprises an antiferromagnetic insulation material or an antiferromagnetic conductive material. The ferromagnetic insulation material comprises one or more of the following materials: $R_3Fe_5O_{12}$, $MFe_2O_4$, $Fe_3O_4$, $BaFe_{12}O_{19}$, $SrFe_{12}O_{19}$, and doped compounds thereof, where R is Y, Pr, Nd, Sm, Eu, Gd, Tb, Dy, Ho, Er, Tm, Yb or Lu, and M is Mn, Zn, Cu, Ni, Mg or Co, the antiferromagnetic insulation material comprises one or more of the following materials: NiO and CoO, and the antiferromagnetic conductive material comprises one or more of the following materials: IrMn, PtMn, AuMn, PdMn, FeMn, and NiMn.

Another exemplary embodiment provides a magnon tunnel junction comprising: a first ferromagnetic layer formed of a ferromagnetic material; a first antiferromagnetic layer located on the first ferromagnetic layer and formed of an antiferromagnetic material; and a second ferromagnetic layer located on the first antiferromagnetic layer and formed of a ferromagnetic material.

In some examples, the ferromagnetic material comprises a ferromagnetic insulation material or a ferromagnetic conductive material, and the antiferromagnetic material comprises an antiferromagnetic insulation material or an antiferromagnetic conductive material. The first ferromagnetic layer has a fixed magnetic moment, and the second ferromagnetic layer has a free magnetic moment that is free to change with an external magnetic field. The magnon tunnel junction further comprises: a second antiferromagnetic layer located on the second ferromagnetic layer and formed of the antiferromagnetic material; and a third ferromagnetic layer located on the second antiferromagnetic layer and formed of the ferromagnetic material. The first ferromagnetic layer and the third ferromagnetic layer have magnetic moments parallel to each other, and the second ferromagnetic layer has a free magnetic moment that is free to change with an external magnetic field.

Another exemplary embodiment provides a magnon memory comprising a plurality of magnon memory cell, the magnon memory cell comprising a magnon tunnel junction comprising a first ferromagnetic layer formed of a ferromagnetic material, an antiferromagnetic layer disposed on the first ferromagnetic layer and formed of an antiferromagnetic material, and a second ferromagnetic layer disposed on the first antiferromagnetic layer and formed of a ferromagnetic material.

The magnon tunnel junction further comprises a second antiferromagnetic layer disposed on the second ferromagnetic layer and formed of the antiferromagnetic material; and a third ferromagnetic layer disposed on the second antiferromagnetic layer and formed of the ferromagnetic material.

The above and other features and advantages of the present disclosure will be apparent from the following description to exemplary embodiments when taken in conjunction with the drawings.

DETAILED DESCRIPTION

An exemplary embodiment of the present disclosure will now be described with reference to the accompanying drawings. It should be noted that the drawings may not be drawn to scale.

Figure 1:
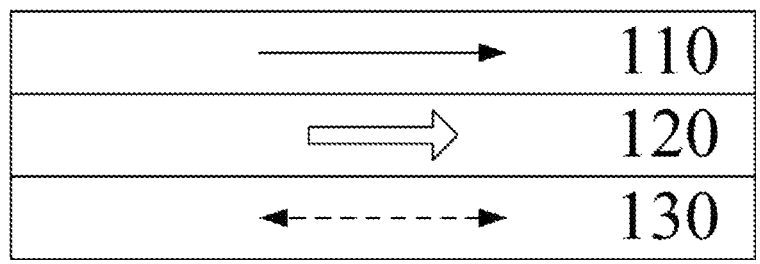
FIG. 1 is a schematic diagram of layer structures of a magnon spin valve (MSV) device according to an exemplary embodiment of the present disclosure.

FIG. 1 is a schematic diagram of layer structures of a magnon spin valve (MSV) device 100 according to an exemplary embodiment of the present disclosure. As shown in FIG. 1, the MSV device 100 includes a first ferromagnetic insulation layer 110, a second ferromagnetic insulation layer 130, and a non-magnetic conductive layer 120 located therebetween.

The first ferromagnetic insulation layer 110 and the second ferromagnetic insulation layer 130 each may be formed of a ferromagnetic insulation material, and the examples thereof include, but not limited to, $R_3Fe_5O_{12}$, wherein R may be Y, Pr, Nd, Sm, Eu, Gd, Tb, Dy, Ho, Er, Tm, Yb and Lu; MFe$_2$O$_4$, wherein M may be Mn, Zn, Cu, Ni, Mg, and Co; and Fe$_3$O$_4$, BaFe$_{12}$O$_{19}$, SrFe$_{12}$O$_{19}$, etc.

In some examples, the first ferromagnetic insulation layer 110 may have a fixed magnetization direction that does not change during operation, as indicated by a solid arrow; while the second ferromagnetic insulation layer 130 may have a free magnetization direction that may change with an external magnetic field, as indicated by a bidirectional dashed arrow. As such the MSV device 100 may be used as a magnon sensor for sensing an external magnetic field. The magnetization direction of the first ferromagnetic insulation layer 110 may be fixed by various manners, for example, by antiferromagnetic pinning, hard magnetic pinning, artificial antiferromagnetic structure (SAF), self-pinning, etc., and all of these manners are known in the art, therefore, these will not be described in detail.

It should also be noted that although FIG. 1 shows an in-plane magnetization direction, the first ferromagnetic insulation layer 110 and the second ferromagnetic insulation layer 130 may also have a perpendicular magnetization direction. It should be understood for those skilled in the art that the setting on the magnetization directions of the first ferromagnetic insulation layer 110 and the second ferromagnetic insulation layer 130 may be similar to the setting on the magnetization directions of two ferromagnetic conductive layers in conventional GMR spin valve structure.

The non-magnetic conductive layer 120 may be formed of a conductive material with a long spin diffusion length, such as, but not limited to, Cu, Ru, Ag, Cr, Au, and the like.

In the MSV device 100, a current may only flow in the plane of the non-magnetic conductive layer 120, as indicated by an open arrow. However, due to scattering at the interface with the first ferromagnetic insulation layer 110 and the second ferromagnetic insulation layer 130, the device 100 may also show the GMR effect, and its principle is substantially the same as that of a conventional GMR device. In short, in a case where the magnetization direction of the first ferromagnetic insulation layer 110 and that of the second ferromagnetic insulation layer 130 are the same as each other, electrons having the same polarity as the magnetic moment are less scattered, therefore, the resistance of the MSV device 100 is lower; in a case where the magnetization direction of the first ferromagnetic insulation layer 110 and that of the second ferromagnetic insulation layer 130 are opposite to each other, all electrons are greatly scattered, therefore, the resistance of the MSV device 100 is higher, thus a magnetoresistance effect is shown. The biggest difference from the conventional GMR device is that in the MSV device 100, electrons flow only in the non-magnetic conductive layer 120 without flowing in the ferromagnetic insulation layers 110 and 130. Thus, since the non-magnetic conductive layer 120 has good conductivity, an improved signal-to-noise ratio may be obtained, and higher magnetoresistance may be contributed to obtaining.

It may be understood that in the MSV device 100, since the first ferromagnetic insulation layer 110 and the second ferromagnetic insulation layer 130 do not participate in electron transport, therefore, there is no particular limitation on the thickness thereof, and it is only necessary to consider providing a suitable magnetic moment. And for the non-magnetic conductive layer 120, preferably, its thickness is smaller than its spin diffusion length.

Figure 2A:
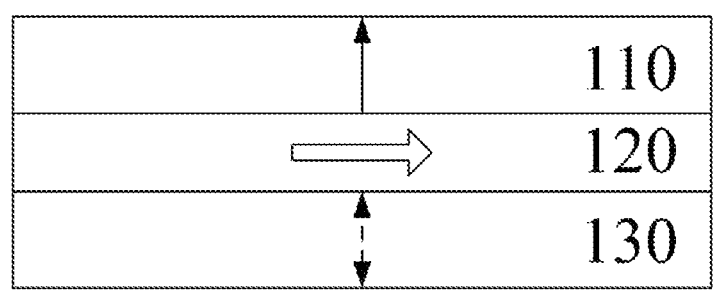
FIG. 2A, FIG. 2B and FIG. 2C are schematic diagrams of some variants of the magnon spin valve (MSV) device of FIG. 1.
Figure 2B:
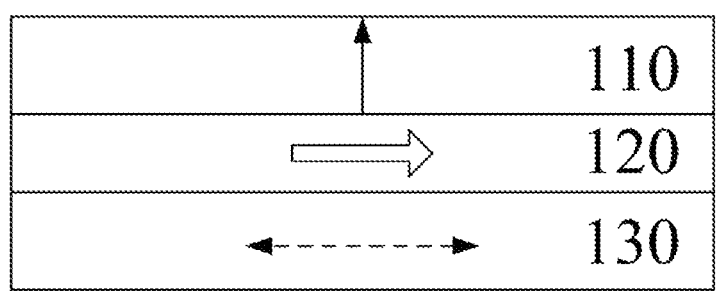
Figure 2C:
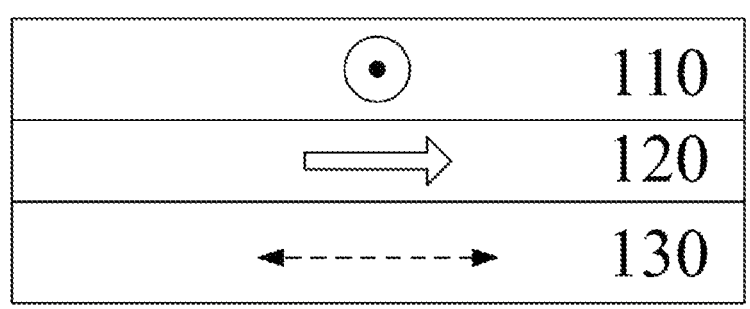

FIG. 2A, FIG. 2B and FIG. 2C are schematic diagrams of some variants of the magnon spin valve (MSV) device of FIG. 1. In FIG. 1, the first ferromagnetic insulation layer 110 and the second ferromagnetic insulation layer 130 respectively have in-plane magnetization directions paralleling or anti-paralleling to each other. In the example of FIG. 2A, the first ferromagnetic insulation layer 110 and the second ferromagnetic insulation layer 130 may have perpendicular magnetization directions paralleling or anti-parallel to each other; alternatively, as shown in FIG. 2B, one of the first ferromagnetic insulation layer 110 and the second ferromagnetic insulation layer 130 may have the in-plane magnetization direction and the other may have the perpendicular magnetization direction. Although it is shown in FIG. 2B that the first ferromagnetic insulation layer 110 has the perpendicular magnetization direction, but it may be the opposite, that is, it has the in-plane magnetization direction, and the second ferromagnetic insulation layer 130 has the perpendicular magnetization direction. In the example of FIG. 2C, the first ferromagnetic insulation layer 110 and the second ferromagnetic insulation layer 130 respectively have the in-plane magnetization directions, but in the absence of an external magnetic field, the magnetic moment of the free magnetic layer 130 may be at an about 90° angle with respect to the reference magnetic layer 110. The examples of FIG. 2B and FIG. 2C are particularly suitable for being used in a variety of magnetic sensor devices.

The case of a single non-magnetic conductive layer 120 has been described above, and it should be understood for those skilled in the art that the MSV device 100 of the present disclosure may further comprise a second non-magnetic conductive layer (not shown) formed on a side of the free magnetic layer 130 opposite to the first non-magnetic conductive layer 120, and a third ferromagnetic insulation layer formed on the second non-magnetic conductive layer. At this time, a current flows in the two non-magnetic conductive layers. This structure is similar to the conventional double barriers structure as described below. In the three ferromagnetic layers of this structure, the intermediate ferromagnetic layer serves as a common free layer, and both the upper ferromagnetic layer and the lower ferromagnetic layer serve as a reference magnetic layer, and the three ferromagnetic layers may have in-plane magnetic moments, or may have perpendicular magnetic moments, or a combination of the in-plane magnetic moments and the perpendicular magnetic moments, as described below with reference to FIG. 8B and FIG. 10A to FIG. 10C.

It should also be understood that the MSV device 100 of the present disclosure may be used to replace the conventional GMR device in various fields, for example, a magnetic read head or a magnetic sensor and the like.

Figure 3:
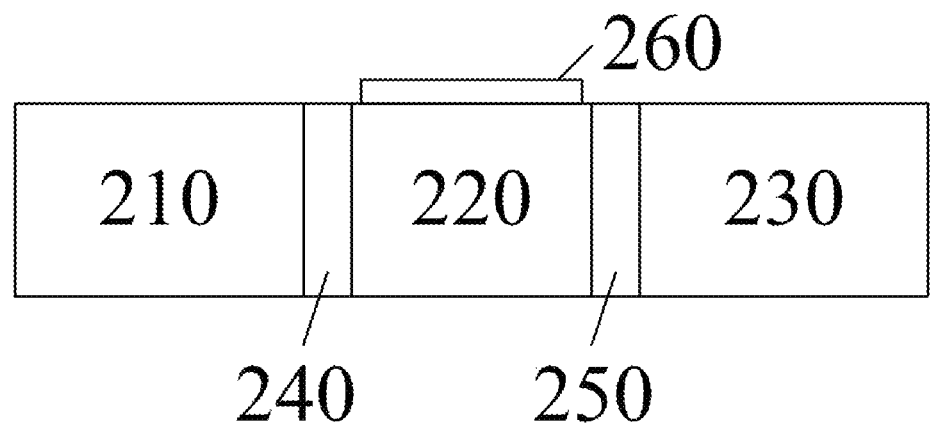
FIG. 3 is a schematic diagram of a structure of a magnon field effect transistor according to an exemplary embodiment of the present disclosure.

FIG. 3 is a schematic diagram of a structure of a magnon field effect transistor 200 according to an exemplary embodiment of the present disclosure. As shown in FIG. 3, the magnon field effect transistor 200 comprises a first ferromagnetic region 210, a second ferromagnetic region 220, a third ferromagnetic region 230, and a first antiferromagnetic region 240 and a second antiferromagnetic region 250 located between adjacent ferromagnetic regions, respectively.

The first ferromagnetic region 210, the second ferromagnetic region 220, and the third ferromagnetic region 230 each may be formed of a ferromagnetic material. The ferromagnetic material comprises a ferromagnetic conductive material or a ferromagnetic insulation material, wherein the second ferromagnetic region 220 is formed of the ferromagnetic insulation material, and the first ferromagnetic region 210 and the third ferromagnetic region 230 may be formed of the ferromagnetic conductive material or the ferromagnetic insulation material. Ferromagnetic conductive materials have been widely used in existing magnetic devices such as spin valves, tunnel junctions and the like, therefore, they will not be described again here. Examples of the ferromagnetic insulation materials that may be used in the present disclosure include, but not limited to: $R_3Fe_5O_{12}$, wherein R may be Y, Pr, Nd, Sm, Eu, Gd, Tb, Dy, Ho, Er, Tm, Yb and Lu; $MFe_2O_4$, wherein M may be Mn, Zn, Cu, Ni, Mg and Co; and $Fe_3O_4$, $BaFe_{12}O_{19}$, $SrFe_{12}O_{19}$, etc. Preferably, the first ferromagnetic region 210, the second ferromagnetic region 220, and the third ferromagnetic region 230 have magnetic moments parallel to each other.

Each of the first antiferromagnetic region 240 and the second antiferromagnetic region 250 may be formed of an antiferromagnetic material comprising an antiferromagnetic conductive material or an antiferromagnetic insulation material. Examples of the antiferromagnetic conductive material include, but not limited to, IrMn, PtMn, AuMn, PdMn, FeMn, NiMn, etc., and examples of the antiferromagnetic insulation material include, but not limited to, NiO, CoO, etc.

Further, all of the ferromagnetic material and antiferromagnetic material as described above may be composed of metals, alloys, semiconductors, insulators, etc.

The magnon field effect transistor 200 further comprises a gate 260 covering the intermediate ferromagnetic region, i.e. the second ferromagnetic region 220. The gate 260 may be formed of a gate material commonly used in the semiconductor field, examples of which include, but not limited to, metal, metal silicide, polysilicon, etc. Since the second ferromagnetic region 220 is formed of the ferromagnetic insulation material, the gate 260 may be in direct contact with the second ferromagnetic region 220. In a case where the first antiferromagnetic region 240 and the second antiferromagnetic region 250 are formed of a conductive material, preferably, the gate 260 is electrically isolated from the first antiferromagnetic region 240 and the second antiferromagnetic region 250.

Figure 4:
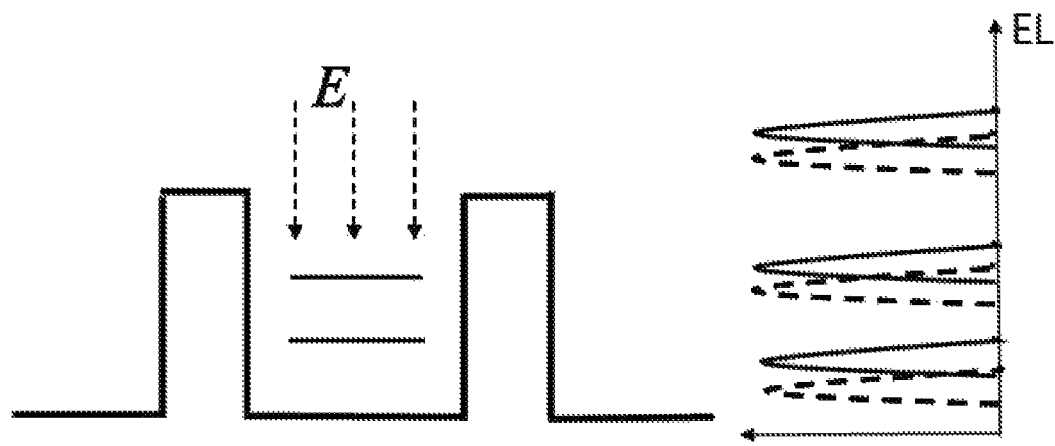
FIG. 4 is a schematic diagram of an energy band of the magnon field effect transistor of FIG. 3.

The working principle of the magnon field effect transistor 200 will be described below with reference to FIG. 4, wherein FIG. 4 is a schematic diagram of an energy band of the magnon field effect transistor 200. The inventors of the present disclosure find that the band gap of the magnons in the antiferromagnetic layer is much larger than that in the ferromagnetic layer, therefore, the antiferromagnetic layer 240 and the antiferromagnetic layer 250 are corresponding to an equivalent barrier layer for magnon, and the ferromagnetic layer between the two antiferromagnetic layers constitutes a potential well of the magnon, wherein the magnetic energy level is quantized. Therefore, similar to the resonance tunneling of electrons, resonance tunneling of the magnon may be realized when the quantization magnon energy level in the second ferromagnetic region 220 is in the proper position.

The gate 260 may induce DMI (Dzyaloshinsky-Moriya Interaction) interaction by applying an electric field to the intermediate ferromagnetic layer 220 to realize the regulation of the quantum well energy level of the magnon, and then to realize the regulation of the magnon stream of resonance tunneling, i.e. the function of the magnon field effect transistor is realized. The right diagram in FIG. 4 shows the change of the magnon energy level EL in the ferromagnetic insulation layer 220 after the electric field E is applied to the intermediate ferromagnetic insulation layer 220 through the gate 260, wherein a solid line indicates the position of the energy level before the electric field E is applied, and a dashed line indicates the position of the energy level after the electric field E is applied. It may be seen that after the electric field E is applied, the energy corresponding to the energy level is decreased. Through regulating the position of the quantization energy level in the intermediate ferromagnetic insulation layer 220 by the gate 260, the resonance tunneling of the magnon stream may be controlled, thus realizing the function of the magnon field effect transistor.

It should be understood that "conduction" and "insulation" are concepts related to electrons, and in the magnon field effect transistor of the present disclosure, instead of electrons, a magnon is used as a signal carrier. In contrast to electrons, the ferromagnetic material is the conductor of magnon, and the antiferromagnetic material is the insulator of magnon. Therefore, in the above magnon field effect transistor, the first to third ferromagnetic regions 210, 220, and 230 are all formed of the ferromagnetic material, and the second ferromagnetic region 220 is formed of the ferromagnetic insulation material because the magnon energy level therein is to be modulated by using the electric field, and the first ferromagnetic region 210 and the third ferromagnetic regions 230 are only used to conduct magnons, and do not involve electric field modulation, therefore, they may be formed of the ferromagnetic conductive material or insulation material. In this way, the device using magnons as the transmission signal stream is realized.

Figure 5:
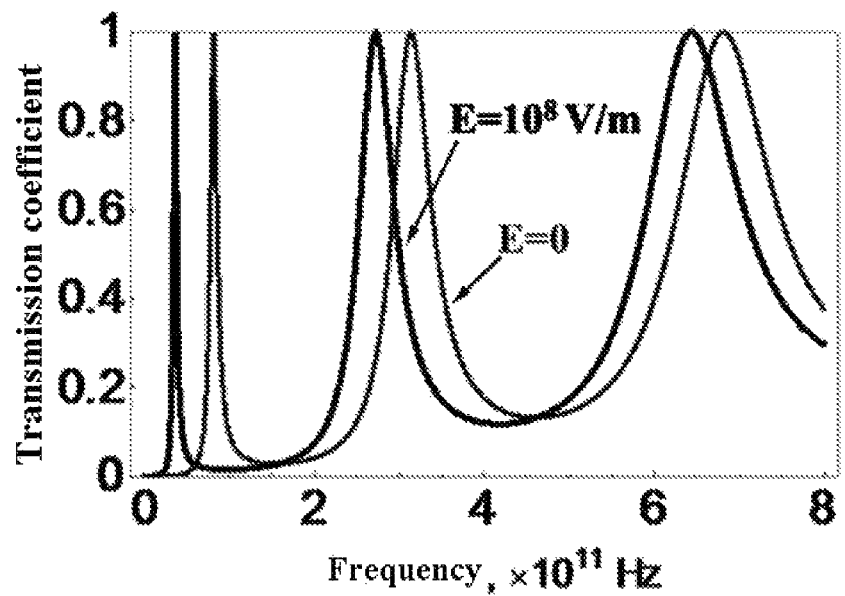
FIG. 5 is a graph showing relationships between magnon transmission coefficient and magnon frequency.

FIG. 5 is a graph showing relationships between magnon transmission coefficient and magnon frequency. It may be seen from the graph of FIG. 5, after an electric field of, for example, $10^8$ V/m is applied, the resonance tunneling frequency of the magnon moves to the left (low frequency) direction with respect to the gate electric field being 0 V/m.

Figure 6:
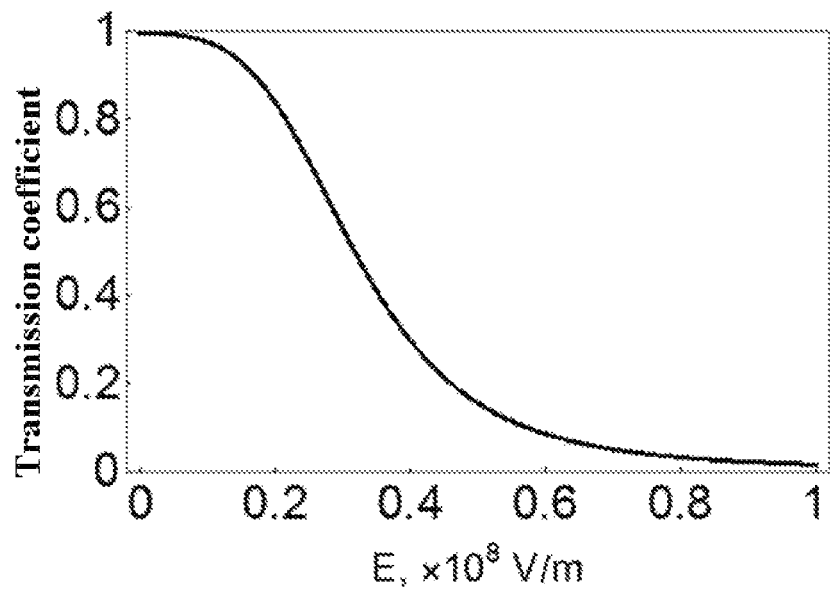
FIG. 6 is a graph showing relationships between transmission coefficient and applied gate electric field for a magnon at a particular resonance tunneling frequency.

FIG. 6 is a graph showing a relationship between transmission coefficient and applied gate electric field for a magnon at a particular resonance tunneling frequency. As shown in FIG. 5, in a case where being initially in a resonance tunneling state, the magnon has a transmission coefficient almost 1, i.e. all the magnons of this frequency may pass through the two barriers by means of resonance tunneling, and the transistor is in an on state. As the applied electric field increases, the quantum energy level in the intermediate ferromagnetic insulation layer 220 shifts, the resonance tunneling phenomenon decreases, and the transmittance of the magnon gradually decreases. In a case where the applied electric field reaches a certain intensity, e.g., $10^8$ V/m, the transmittance of the magnon is almost decreased to zero, the resonance tunneling phenomenon hardly occurs, and the transistor is in an off state.

It should also be understood that when an electric field is not applied, the position of the quantization energy level in the intermediate ferromagnetic insulation layer 220 depends on the width of the potential well, the height of barriers on both sides, etc. Therefore, it may also appropriately set the parameters of each layer in the transistor 200 such that the transistor is in the off state in an initial state, i.e. in a case where an electric field is not applied; and in a case where an appropriate electric field is applied, the transistor is in the on state.

Unlike the conventional semiconductor or spin transistor that use electron as the signal carrier, the transistor of the present disclosure completely uses magnon as the signal carrier, and does not involve any transmission of electron within the transistors. Magnon may carry an angular momentum like electron and may be used as the carrier of information. The difference is that since the movement of the charge is not involved, the magnetron will not generate Joule heat during the transmission process, therefore, information processing and operation using the magnon will have the characteristic of low power consumption.

It should be understood that the magnon transistor of the present disclosure may be used with conventional circuits. For example, at one end of the transistor, a magnon stream may be generated from an electrical signal by a spin-orbit coupling effect in a spin Hall effect (SHE) material and injected into one end of the transistor; at another end of the transistor, magnon stream of resonance tunneling may be received and converted into a voltage or current signal also in the spin Hall effect material. On the other hand, the magnon transistor of the present disclosure may also be used in future pure magnon circuit.

Figure 7:
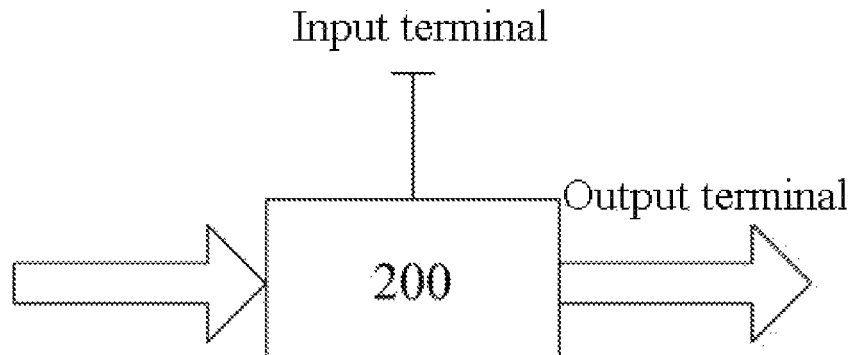
FIG. 7 is a schematic diagram in a case where a magnon field effect transistor according to an exemplary embodiment of the present disclosure is used as a logic device.

The magnon transistor of the present disclosure may be used in many fields instead of the conventional transistor, and FIG. 7 shows an example in which the magnon field effect transistor of the present disclosure is used as a logic device.

As shown in FIG. 7, a gate may be defined as an input terminal, a gate voltage is defined as a logic input, a transmission terminal is defined as an output terminal, and a transmitted magnon stream is as a logic output. It should be understood that the magnon field effect transistor of the present disclosure has a symmetrical structure, therefore, either of the first ferromagnetic region 210 and the third ferromagnetic region 230 may be used as a magnon stream input terminal and the other as a magnon stream output terminal. Therefore, either of the first ferromagnetic region 210 and the third ferromagnetic region 230 may be used as a logic output terminal. In a case where the gate voltage is not applied, it is defined as an input "0", at this time, the magnon at a specific resonance tunneling may be completely transmitted, and the magnon field effect transistor is in an ON state, corresponding to an output "1"; in a case where an appropriate gate voltage is applied, it is defined as an input "1", which may make the magnon completely not to be able to be transmitted through by shifting the resonance energy level, at this time, the magnon field effect transistor is in an OFF state, corresponding to an output "0". Therefore, such a single magnon field effect transistor may realize a "NON" logic operation. Once the logical "NON" operation may be realized, all other logic functions, such as "AND", "OR", etc., may be realized in principle by a cascade combination of a plurality of such magnon field effect transistors.

Figure 8A:
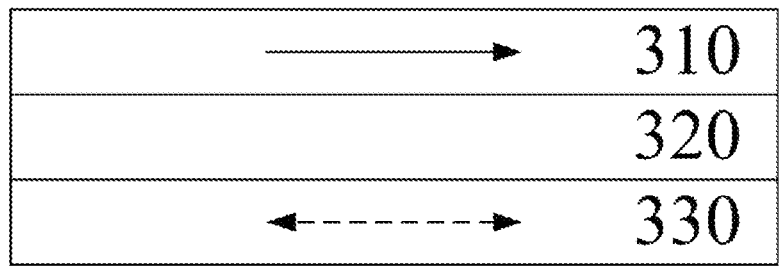
FIG. 8A and FIG. 8B are schematic diagrams showing layer structures of a magnon tunnel junction according to an exemplary embodiment of the present disclosure.

The magnon field effect transistor is described above, and it should be understood for those skilled in the art that a magnon double barriers tunnel junction (be composed of layers 210-250) is used in the magnon field effect transistor. Other embodiments of the present disclosure also provide such a magnon tunnel junction, including a single barrier tunnel junction shown in FIG. 8A and a double barriers tunnel junction shown in FIG. 8B. As shown in FIG. 8A, a single barrier tunnel junction 300 comprises a first ferromagnetic layer 310 and a second ferromagnetic layer 330, and a first antiferromagnetic layer 320 therebetween. The first ferromagnetic layer 310 and the second ferromagnetic layer 330 may be made of a ferromagnetic conductive material or insulation material, and the first antiferromagnetic layer 320 may be made of an antiferromagnetic conductive material or insulation material. The first ferromagnetic layer 310 may be used as a reference magnetic layer, the second ferromagnetic layer 330 may be used as a free magnetic layer, and the first antiferromagnetic layer 320 may be used as a barrier layer. The magnetization orientation of the first ferromagnetic layer 310 and the second ferromagnetic layer 330 may affect the tunneling probability of the magnons. In a case where the magnetization directions of the first ferromagnetic layer 310 and the second ferromagnetic layer 330 are parallel to each other, the tunneling probability of the magnon is high, and the magnetic resistance of the tunnel junction is low; and in a case where the magnetization directions of the first ferromagnetic layer 310 and the second ferromagnetic layer 330 are anti-parallel to each other, the tunneling probability of the magnon is low, and the magnetic resistance of the tunnel junction is high.

Figure 8B:
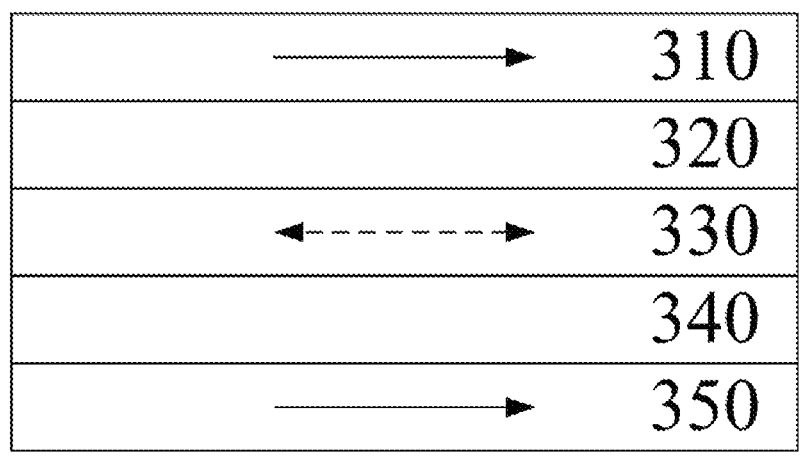

FIG. 8B shows a magnon double barrier tunnel junction 300', which further comprises a second antiferromagnetic layer 340 and a third ferromagnetic layer 350 on the bases of the single barrier tunnel junction 300, wherein the second antiferromagnetic layer 340 is located between the second ferromagnetic layer 330 and the third ferromagnetic layer 350. Similarly, the third ferromagnetic layer 350 may be made of the ferromagnetic conductive material or insulation material, and the second antiferromagnetic layer 340 may be made of the antiferromagnetic conductive material or insulation material. The third ferromagnetic layer 350 also has a fixed magnetic moment that is parallel to that of the first ferromagnetic layer 310, and the second ferromagnetic layer 330 is used as a free magnetic layer. Depending on the magnetization direction of the second ferromagnetic layer 330 is in a parallel state or antiparallel state, the probability of the magnon tunneling through the first antiferromagnetic layer 320 and the second antiferromagnetic layer 340 is high or low, such that the magnetic resistance of the double barriers tunnel junction is low or high. It should be understood that the magnon tunnel junction may comprise three potential barriers or more potential barriers, although the single potential barrier or the double potential barriers are shown at above.

It should be understood that, for magnetic properties, the magnon tunnel junction of the present disclosure is the same as the tunnel junction using electrons as a transmission stream in the prior art, therefore, many aspects of the conventional tunnel junction may also be applied to the magnon tunnel junction of the present disclosure, including but not limited to bias and pinning of the magnetic moment, the magnetization direction being configured as in-plane, perpendicular or a combination thereof, etc. These aspects will not be described here in detail.

Figure 9A:
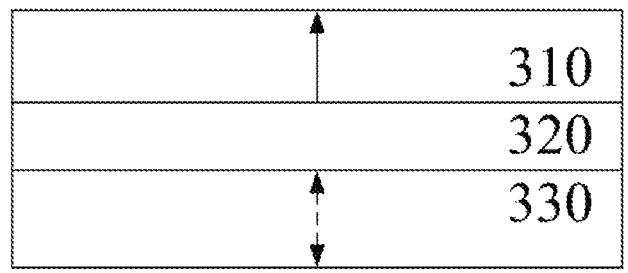
FIG. 9A, FIG. 9B and FIG. 9C are schematic diagrams of some variants of the magnon single barrier tunnel junction of FIG. 8A.
Figure 9B:
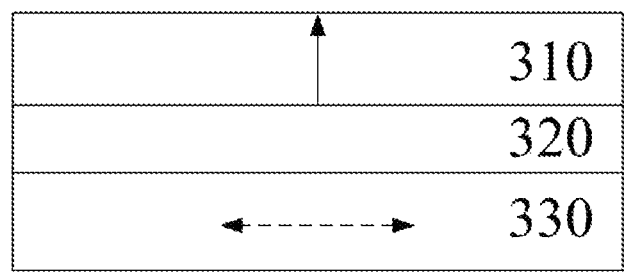
Figure 9C:
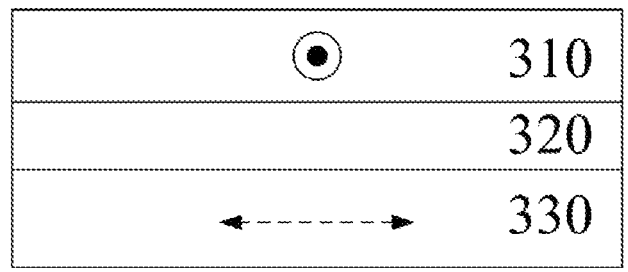
Figure 10A:
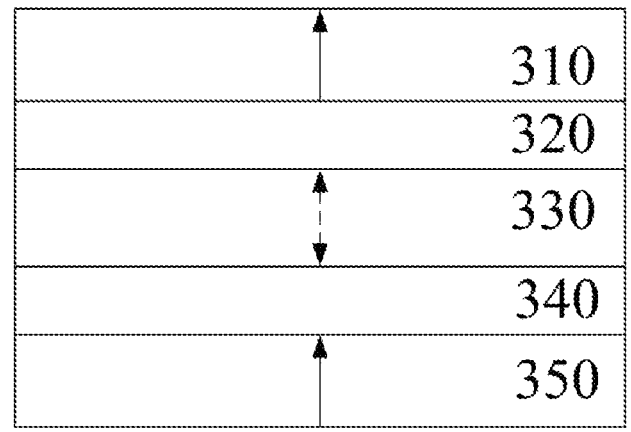
FIG. 10A, FIG. 10B and FIG. 10C are schematic diagrams of some variants of the magnon double barriers tunnel junction of FIG. 8B.
Figure 10B:
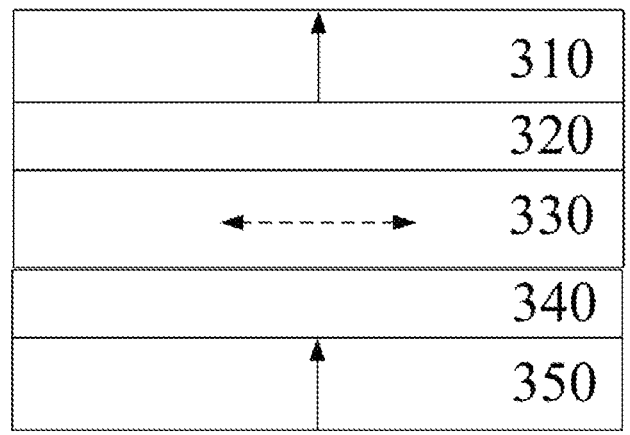
Figure 10C:
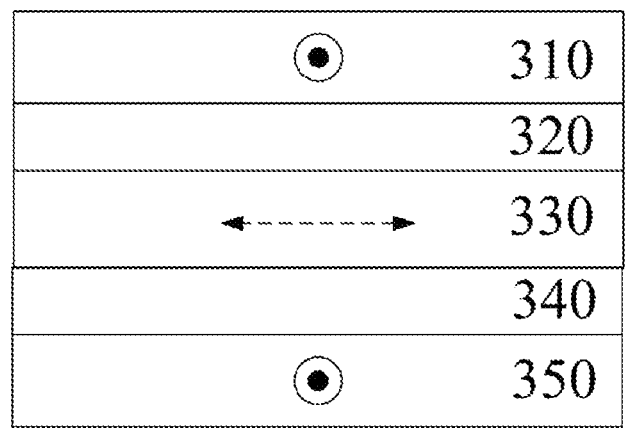

FIG. 9A, FIG. 9B and FIG. 9C are schematic diagrams of some variants of the magnon single barrier tunnel junction of FIG. 8A, and FIG. 10A, FIG. 10B and FIG. 10C are schematic diagrams of some variants of the magnon double barrier tunnel junction of FIG. 8B. In FIG. 9A, both the first ferromagnetic layers 310 and the second ferromagnetic layer 330 have perpendicular magnetizations; in FIG. 9B, one of the first ferromagnetic layers 310 and the second ferromagnetic layer 330 has a perpendicular magnetization and the other has an in-plane magnetization; in FIG. 9C, both the first ferromagnetic layers 310 and the second ferromagnetic layer 330 both have in-plane magnetizations, but in the absence of an external magnetic field, their magnetization directions may be at around 90° angles to each other. Similarly, in FIG. 10A, all of the first ferromagnetic layer 310, the second ferromagnetic layer 330, and the third ferromagnetic layer 350 have perpendicular magnetizations; in FIG. 10B, the first ferromagnetic layer 310 and the third ferromagnetic layer 350 have perpendicular magnetizations, and the second ferromagnetic layer 330 has an in-plane magnetization, or the first ferromagnetic layer 310 and the third ferromagnetic layer 350 have in-plane magnetizations, and the second ferromagnetic layer 330 has a perpendicular magnetization; in FIG. 10C, all of the first ferromagnetic layer 310, the second ferromagnetic layer 330, and the third ferromagnetic layer 350 have in-plane magnetizations, however, in the absence of an external magnetic field, the magnetization directions of the first ferromagnetic layer 310 and the third ferromagnetic layer 350 are at around 90-degree angles to the magnetization direction of the second ferromagnetic layer 330. Those skilled in the art should understand that the magnetization direction of each ferromagnetic layer may be configured for different application scenarios.

The above description has been provided for the purposes of illustration and description. In addition, this description is not intended to limit the embodiments of the present disclosure to the forms disclosed herein. Although various example aspects and embodiments have been discussed above, those skilled in the art will recognize certain variations, modifications, alterations, additions and sub-combinations thereof.

What is claimed is:

1. A magnon tunnel junction, comprising:
    a first ferromagnetic layer formed of a ferromagnetic insulation material for conducting magnons;
    a first antiferromagnetic layer located on the first ferromagnetic layer and formed of an antiferromagnetic insulation material, the first antiferromagnetic layer serving as a barrier layer for magnons; and
    a second ferromagnetic layer located on the first antiferromagnetic layer and formed of a ferromagnetic insulation material for conducting magnons,
    wherein the ferromagnetic insulation material comprises one or more of the following materials: $R_3Fe_5O_{12}$, $MFe_2O_4$, $BaFe_{12}O_{19}$, $SrFe_{12}O_{19}$, and doped compounds thereof, where R is Y, Pr, Nd, Sm, Eu, Gd, Tb, Dy, Ho, Er, Tm, Yb or Lu, and M is Mn, Zn, Cu, Ni, Mg or Co, and
    wherein the antiferromagnetic insulation material comprises one or more of the following materials: NiO and CoO.

2. The magnon tunnel junction of claim 1, wherein the first ferromagnetic layer has a fixed magnetic moment, and the second ferromagnetic layer has a free magnetic moment that is free to change with an external magnetic field.

3. The magnon tunnel junction of claim 1, wherein the first ferromagnetic layer, the second ferromagnetic layer, and the third ferromagnetic layer have magnetic moments parallel to each other.

* * * * *